United States Patent
Hsiung et al.

(10) Patent No.: US 8,884,334 B2
(45) Date of Patent: Nov. 11, 2014

(54) COMPOSITE LAYER STACKING FOR ENHANCEMENT MODE TRANSISTOR

(71) Applicant: Taiwan Semiconductor Manufacturing Co., Ltd., Hsin-Chu (TW)

(72) Inventors: Chih-Wen Hsiung, Hsinchu (TW); Chen-Ju Yu, Jiaoxi Township (TW); Fu-Wei Yao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 90 days.

(21) Appl. No.: 13/672,754

(22) Filed: Nov. 9, 2012

(65) Prior Publication Data
US 2014/0131720 A1   May 15, 2014

(51) Int. Cl.
*H01L 29/778* (2006.01)
*H01L 21/335* (2006.01)
*H01L 21/205* (2006.01)

(52) U.S. Cl.
CPC ........ *H01L 29/7781* (2013.01); *H01L 21/2056* (2013.01)
USPC ............ 257/194; 257/E29.246; 257/E29.252; 257/E21.403; 438/172

(58) Field of Classification Search
USPC ........... 257/194, E29.246, E29.252, E21.403; 438/172
See application file for complete search history.

(56) References Cited

U.S. PATENT DOCUMENTS

| | | | |
|---|---|---|---|
| 8,344,419 B2 * | 1/2013 | Kikkawa | 257/192 |
| 2009/0072240 A1 * | 3/2009 | Suh et al. | 257/76 |
| 2011/0241017 A1 * | 10/2011 | Ikeda et al. | 257/76 |
| 2012/0056191 A1 * | 3/2012 | Endo et al. | 257/76 |
| 2012/0205717 A1 * | 8/2012 | Kurahashi | 257/194 |
| 2013/0248934 A1 * | 9/2013 | Kikkawa | 257/194 |
| 2013/0313561 A1 * | 11/2013 | Suh | 257/76 |
| 2013/0316502 A1 * | 11/2013 | Mishra et al. | 438/172 |
| 2013/0320349 A1 * | 12/2013 | Saunier et al. | 257/76 |
| 2014/0001478 A1 * | 1/2014 | Saunier et al. | 257/76 |
| 2014/0021513 A1 * | 1/2014 | Akiyama et al. | 257/194 |
| 2014/0070280 A1 * | 3/2014 | Briere | 257/194 |
| 2014/0084300 A1 * | 3/2014 | Okamoto et al. | 257/76 |

OTHER PUBLICATIONS

Amano, H. et al., "Metalorganic vapor phase epitaxial growth of a high quality GaN film using an AlN buffer layer", Appl. Phys. Lett., Feb. 1986, 48(5):353-355.
Nakamura, S., "GaN Growth Using GaN Buffer Layer", Japanese Journal of Applied Physics, Oct. 1991, 30 (10A):L1705-L1707.
Kanamura, M. et al., "Enhancement-Mode GaN MIS-HEMTs With n-GaN/i-AlN/n-GaN Triple Cap Layer and High-k Gate Dielectrics", IEEE Electronic Device Letters, Mar. 2010, 31(3):189-191.

* cited by examiner

*Primary Examiner* — Victor A Mandala
(74) *Attorney, Agent, or Firm* — Duane Morris LLP

(57) ABSTRACT

A transistor includes a first layer of a first type disposed over a buffer layer and having a first concentration of a first material. A first layer of a second type is disposed over the first layer of the first type, and a second layer of the first type is disposed over the first layer of the second type. The second layer of the first type having a second concentration of a first material that is greater than the first concentration of the first material. A source and a drain are spaced laterally from one another and are disposed over the buffer layer. A gate disposed over at least a portion of the second layer of the first type and disposed within a recessed area defined by the first and second layers of the first type and the first layer of the second type.

21 Claims, 8 Drawing Sheets

COMPOSITE LAYER STACKING FOR ENHANCEMENT MODE TRANSISTOR

FIELD OF DISCLOSURE

The disclosed devices and methods relate to semiconductor integrated circuits. More particularly, the disclosed devices and methods relate to transistors for semiconductor integrated circuits.

BACKGROUND

Gallium nitride (GaN)-based devices are increasingly implemented in high-power application such as power switching devices and wireless base stations. Another example of a GaN-based device is a GaN high-electron-mobility transistor (HEMT) amplifier, which have low on-resistance, high-off breakdown voltages, and the ability to handle large current. GaN-based enhancement-mode devices operate in a similar manner to silicon-based MOSFET devices by being normally off in a non-conducting state. However, conventional GaN-based enhancement-mode transistors typically have threshold voltage (Vth) uniformity issues, which leads to unreliable device performance.

DETAILED DESCRIPTION

This description of the exemplary embodiments is intended to be read in connection with the accompanying drawings, which are to be considered part of the entire written description.

Figure 1A:
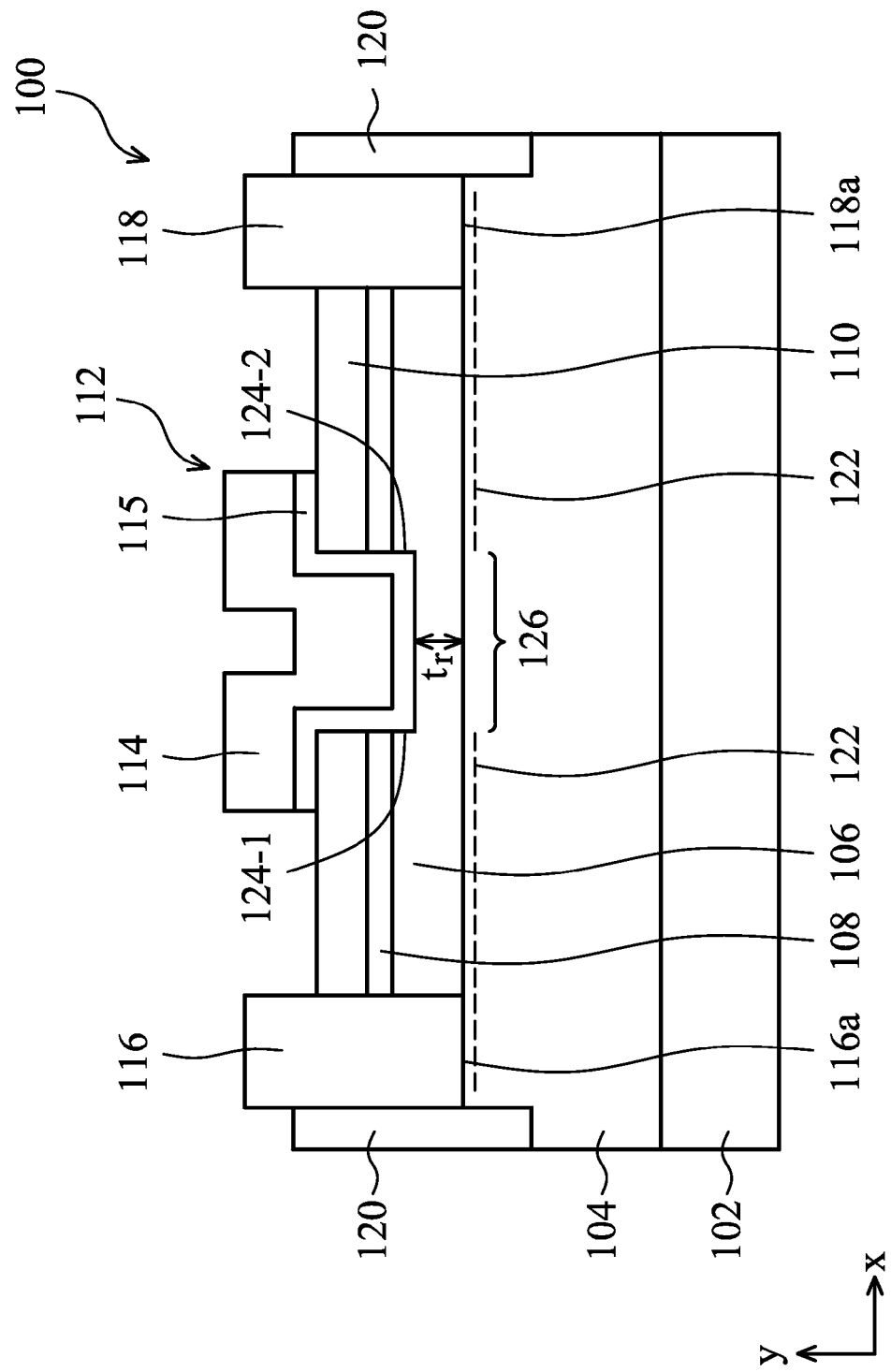
FIG. 1A is a cross-sectional view of one example of an enhancement mode transistor in accordance with some embodiments.
Figure 1B:
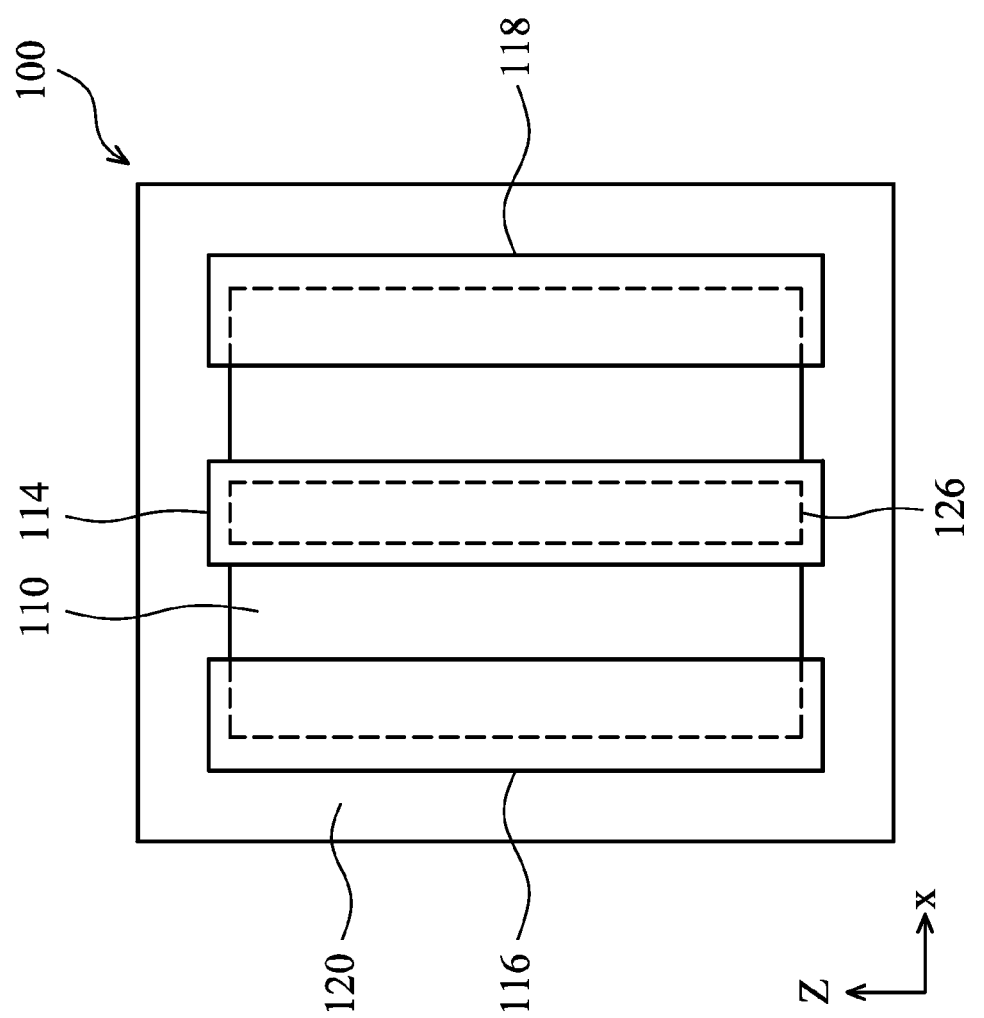
FIG. 1B is a plan view of the enhancement mode transistor illustrated in FIG. 1A.

The disclosed transistor structure, and the associated fabrication method, advantageously provide an enhancement mode transistor having a uniform threshold voltage (Vth). FIG. 1A is a cross-sectional view of one example of a GaN enhancement-mode transistor 100, and FIG. 1B is a plan view of the GaN enhancement-mode transistor 100. As shown in FIGS. 1A and 1B, transistor 100 includes a semiconductor substrate 102 over which a GaN buffer layer 104 is formed. Examples of substrate 102 include, but are not limited to, silicon, silicon carbide (SiC), sapphire, or a bulk III-V semiconductor substrate.

In some embodiments, GaN buffer layer 104 includes a plurality of layers. For example, a layer of aluminum nitride (AlN) is formed directly over the upper surface of substrate 102 over which a layer of graded AlGaN is formed. A layer of GaN is disposed over the AlGaN layer such that GaN buffer layer 104 includes three separate layers. In some embodiments, the film is formed via epitaxial growth as will be understood by one of ordinary skill in the art.

A first layer of a first material type 106 is formed on the upper surface of GaN buffer layer 104. In some embodiments, the first layer of the first material type 106 includes a semiconductor material such as, for example, aluminum gallium nitride (AlGaN) formed with a thickness between 5 to 10 nm and having an aluminum concentration (percentage by weight) of 0.07 and 0.15. A first layer of a second material type 108 is disposed over an upper surface of layer 106. In some embodiments, the first layer of the second material type 108 is a semiconductor material such as, for example, aluminum nitride (AlN) having a thickness (e.g., y-dimension) range of 0.7 to 2 nm. A second layer of the first material type 110 is disposed over the upper surface of layer 108. In some embodiments, the second layer of the first material type 110 is a semiconductor material comprising AlGaN having a higher aluminum content and a different thickness than layer 106. For example, layer 110 can be formed such that it has a thickness between and including 5 and 30 nm with an aluminum concentration (percentage by weight) between 0.21 and 0.50.

Layers 106, 108, and 110 are at least partially interrupted by a recessed gate structure 112, which includes a gate material 114 disposed over an optional dielectric material 116. As shown in FIG. 1A, gate structure 112 extends from an upper surface of layer 110 through layers 108 and 110 and at least partially into layer 106. In some embodiments, the thickness of layer 106 below gate structure 112, $t_r$, is reduced compared to the thickness of the remainder of layer 106. The $t_r$ dimension can be controlled by the aluminum concentration (percentage by weight) of layer 106. For example, with an aluminum concentration (percentage by weight) of 0.12, the $t_r$ dimension is 5 nm.

In some embodiments, dielectric layer 115 has a thickness within the range of 3 to 100 nm. Examples of the materials from which dielectric layer 115 can be formed include, but are not limited to, silicon dioxide ($SiO_2$), silicon nitride ($Si_3N_4$), aluminum oxide ($Al_2O_3$), tantalum pentoxide ($Ta_2O_3$), titanium dioxide ($TiO_2$), zinc peroxide ($ZiO_2$), hafnium oxide ($HfO_2$), and composites films to list but only a few possible materials. Gate 114 can be a metal gate formed from, for example, titanium nitride (TiN), aluminum (Al), gold (Au), tantalum (Ta), tantalum nitride (TaN), niobium (Nb), tungsten (W), nickel (Ni), or gate 114 can be a polysilicon gate as will be understood by one of ordinary skill in the art. In some embodiments, gate 114 is a stack of TiN/Al, Ni/Au, WN/Al, or TiW/Al.

A source 116 and a drain 118 are formed over an upper surface of GaN buffer layer 104 such that source 116 and drain 118 are spaced laterally from one another in a first direction (i.e., in the x-direction). As will be understood by one of ordinary skill in the art, source 116 and drain 118 can be ohmic contacts including conductive materials such as, for example, titanium (Ti), TiN, Al, Ni, Au, or other suitable conductive materials. In some embodiments, for example, source 116 and drain 118 can be a stack of Ti/Al/Ni/Au or a stack of Ti/Al/TiN. Source 116 and drain 118 extend in a second direction that is perpendicular to the first direction (i.e., in the z-direction as illustrated in FIG. 1B) such that they are parallel with one another and with gate 114, which is disposed between source 116 and gate 118.

An isolation device 120 is formed around a periphery of transistor 100 as illustrated in FIG. 1B. In some embodiments, isolation device 120 extends below an uppermost surface of GaN buffer layer 104 such that isolation device 120 extends below the lower surfaces 116a, 118a of source 116 and drain 118, respectively, as best seen in FIG. 1A. In some embodiments, isolation device 120 is formed by etching a recess around the active area of the transistor 100 and depositing an isolation material, such as silicon dioxide, into the recess. In some embodiments, isolation device 120 is formed by implantation or by creating a shallow trench isolation (STI) structure as will be understood by one of ordinary skill in the art.

A two-dimensional electron gas (2DEG) 122 is formed at the upper surface of GaN buffer layer 104. As shown in FIG. 1, the 2DEG 122 laterally extends from isolation device 120-1 to an edge 124-1 of recessed area 126 in which at least part of the recessed gate structure 112 is disposed. Similarly, 2DEG 122 laterally extends from isolation device 120-2 to edge 124-2 of recessed area 126.

Figure 2:
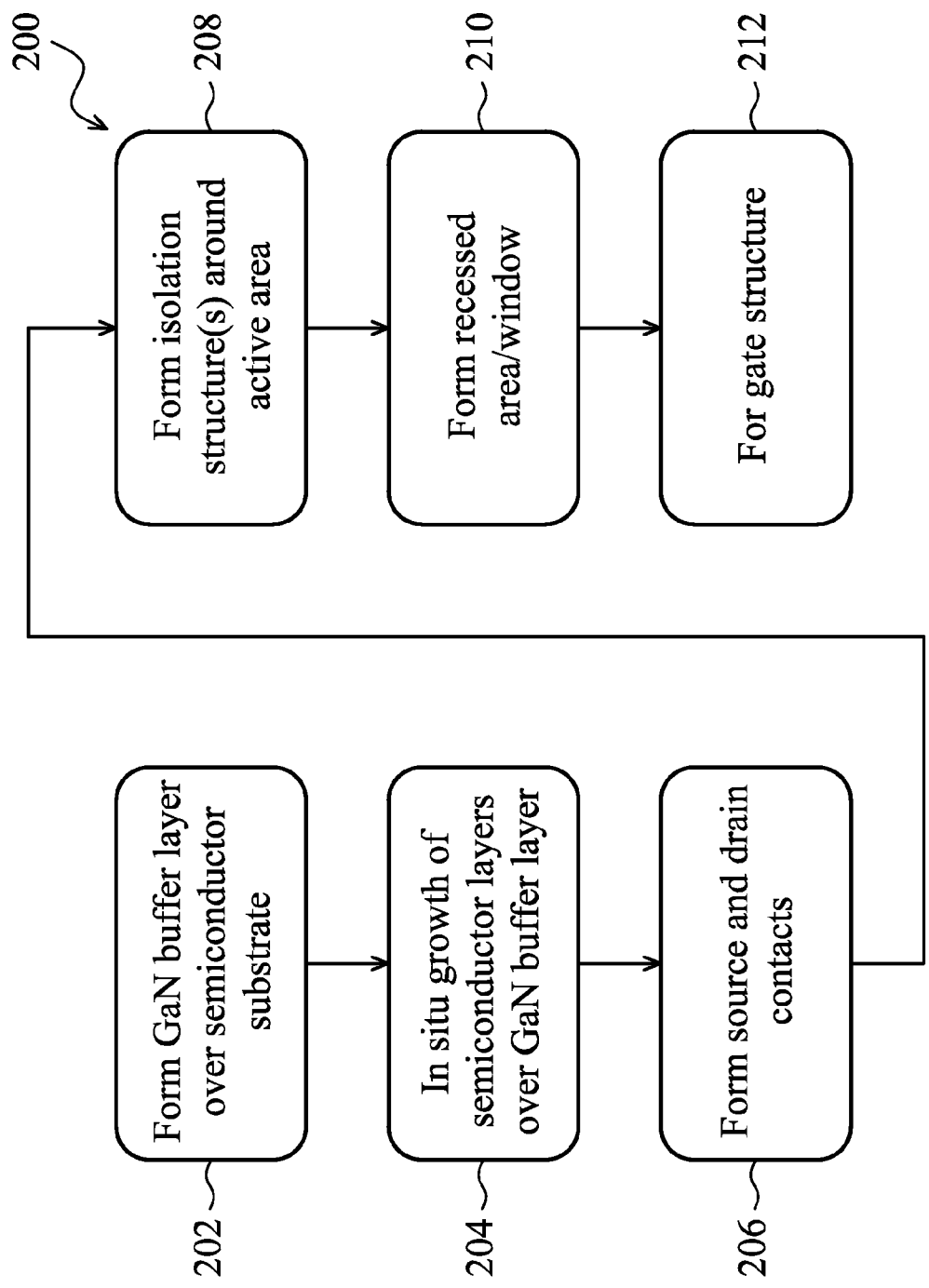
FIG. 2 is a flow diagram of one example of a method of fabricating an enhancement mode transistor in accordance with some embodiments.
Figure 3A:
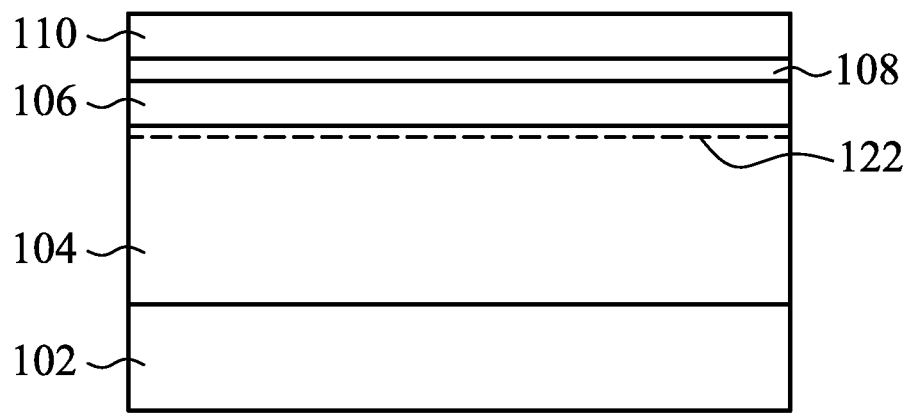
FIGS. 3A-3F are cross-sectional views of an enhancement-mode transistor at various stages during one example of a fabrication process.
Figure 3B:
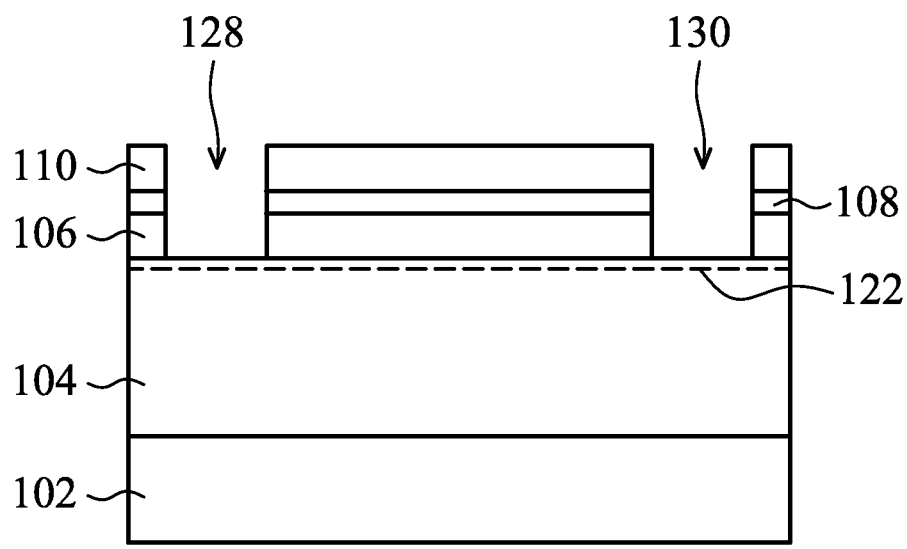
Figure 3C:
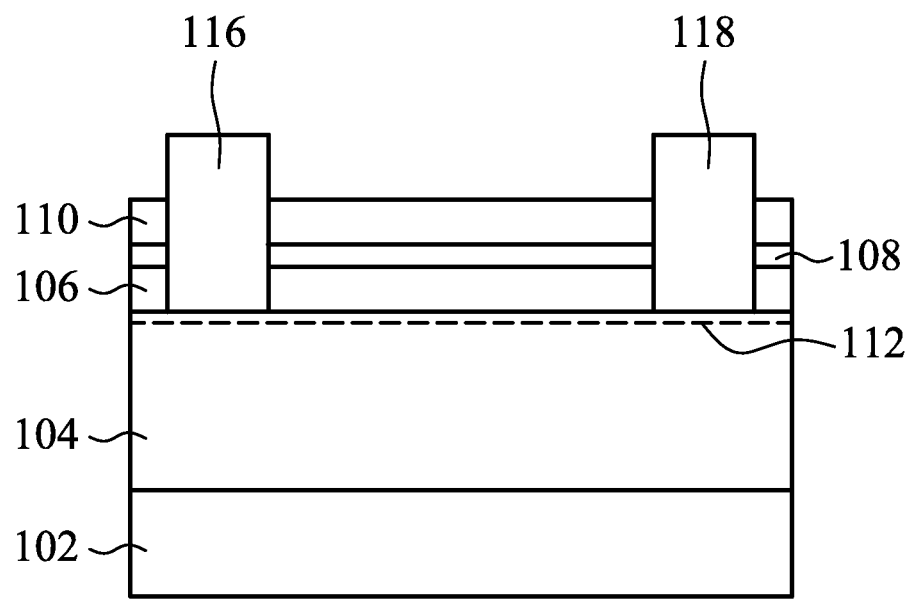
Figure 3D:
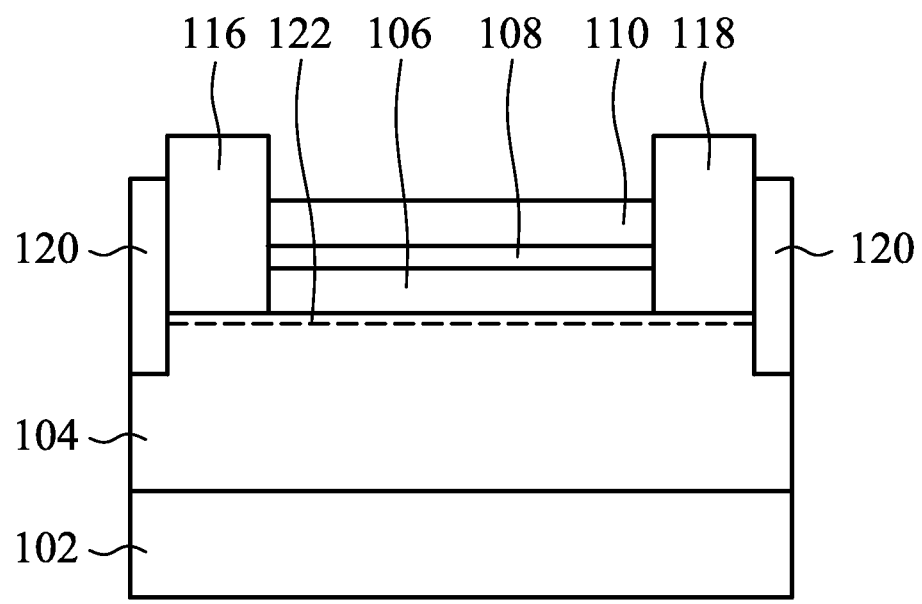
Figure 3E:
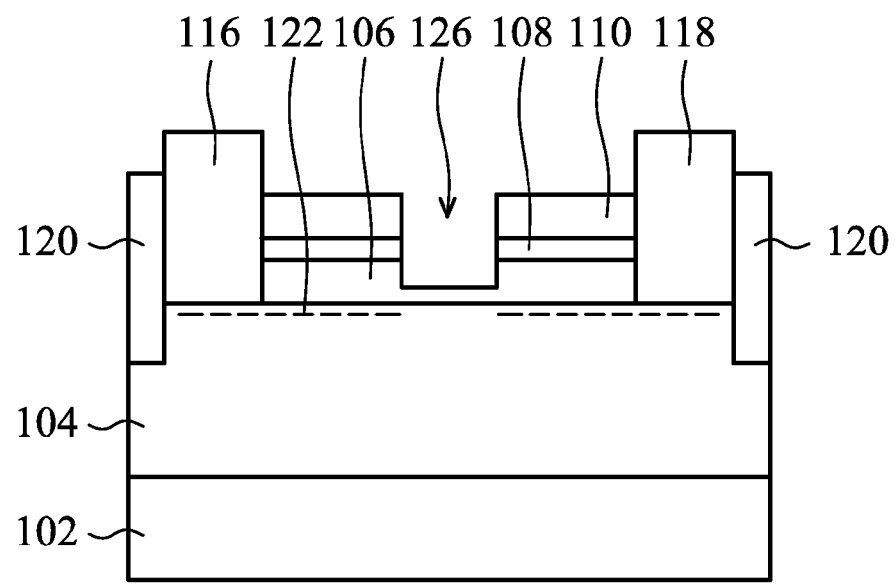
Figure 3F:
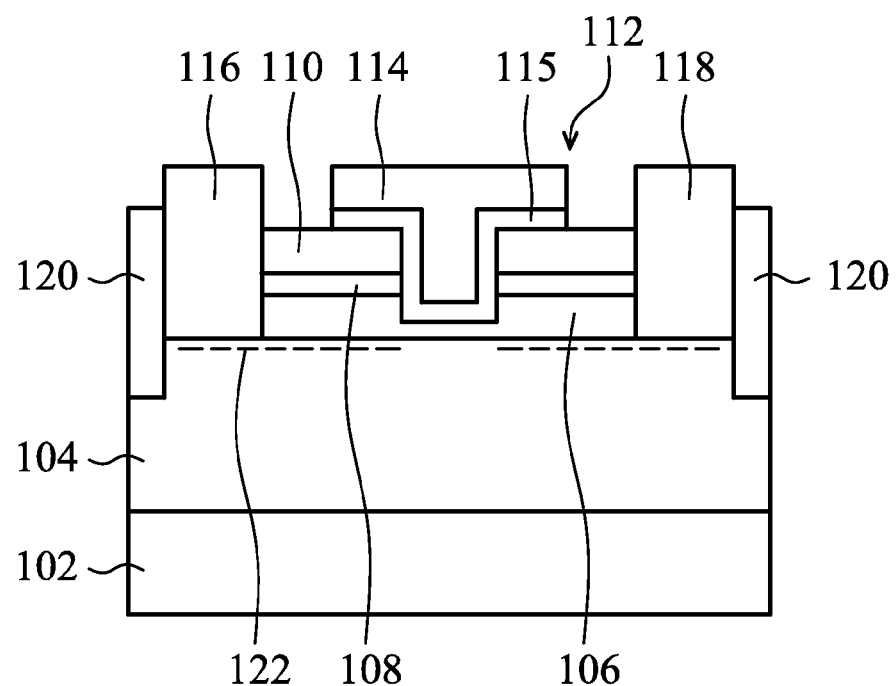

The process of forming a transistor 100 is described with reference to FIGS. 2-3E. Referring first to FIG. 2, GaN buffer layer 104 is formed over semiconductor substrate 102 at block 202. In some embodiments, GaN buffer layer 104 is grown over substrate 102 using a metalorganic chemical vapor deposition (MOCVD) process in which trimethylgallium (TMG) and ammonia ($NH_3$) are used as the Ga and N sources, respectively.

In some embodiments, GaN layer 104 includes as plurality of layers. In such embodiments, each of the layers of GaN buffer layer 104 are sequentially formed. For example, a layer of AlN is formed directly over the upper surface of substrate 102. A layer of graded AlGaN is formed directly over the AN layer, and a layer of GaN is disposed over the AlGaN layer.

At block 204, layers 106, 108, and 110 are grown in situ over GaN buffer layer 104. FIG. 3A illustrates one example of layers 106, 108, and 110 having been formed over GaN buffer layer 104, which is disposed over substrate 102. Layers 106, 108, 110 are grown in situ using a MOCVD process such that layer 106 has a lower Al content than layer 110. In some embodiments, layer 106 has an Al content (percentage by weight) between 0.07 and 0.15, and layer 110 has an Al content (percentage by weight) between 0.21 and 0.50. The formation of layer 106 over GaN buffer layer 104 creates 2DEG 122 as illustrated in FIG. 3A.

At block 206 (FIG. 2), the source 116 and drain 118 contacts are formed. In some embodiments, layers 106, 108, 110 are etched to provide openings 128 and 130 such that the upper surface of GaN barrier layer 104 are exposed as illustrated in FIG. 3B. One example of the parameters of an etching process includes a power range between 50 W and 300 W with a pressure of 30 mTorr using an etching gas mixture ratio of 20% $SF_6$ and 80% $BCl_3$. Ohmic contacts for the source 116 and drain 118 are formed in openings 128 and 130, respectively, as illustrated in FIG. 3C by metal deposition. For example, contacts 116, 118 can be formed using a combination of titanium, aluminum, and gold, e.g., Ti/Al/Ti/Au, a combination of palladium (Pd) and gold, e.g., Pd/Au, or a combination of titanium, aluminum, and titanium nitride, e.g., Ti/Al/TiN.

At block 208 (FIG. 2), isolation region 120 is formed around the active area of transistor being fabricated. In some embodiments, such as the embodiment illustrated in FIG. 3D, isolation region 120 is formed by forming a recess laterally adjacent to source 116 and gate 118 or implanting an isolation ion in the region 120. As shown in FIG. 3D, isolation region 120 extends below the lower surfaces of layer 106, source 116, and drain 118 such that the lower surface of isolation region 120 is disposed below the upper surface of GaN buffer layer 104. One example of the isolation ion implanted to create isolation region 120 includes, but is not limited to, oxygen, nitrogen, or argon.

At block 210 (FIG. 2), recessed area 126 is formed in layers 106, 108, and 110. One or more etching processes are used to form recessed area 126 as will be understood by one of ordinary skill in the art with layer 108 serving as an etch stop layer when layer 110 is etched.

Figure 4:
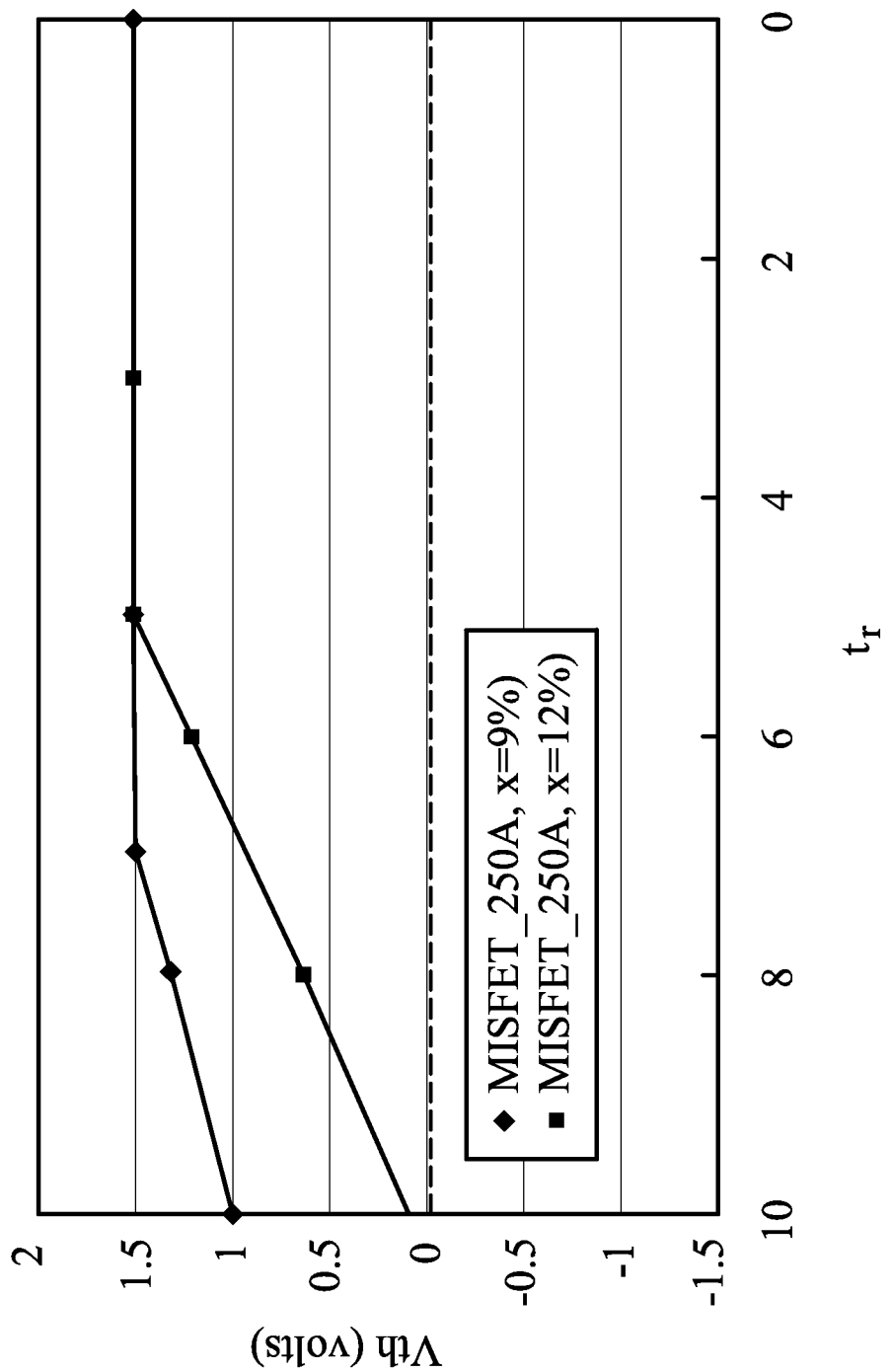
FIG. 4 is a plot of threshold voltage versus thickness of a layer below the gate structure.

By forming layers 106 and 110 with different Al contents, the depth to which layer 110 is etched (and thus the $t_r$ dimension) can be controlled better while providing improved device characteristics. For example, the higher Al content in layer 110 provides for better sheet resistances in the access region, which results in better turn on characteristics, and controlling the $t_r$ dimension with the lower Al content in layer 106 enables the Vth of transistor 100 to be more uniformly fabricated. As shown in FIG. 4, the Vth of transistor 100 is dependent on the $t_r$ dimension such that a $t_r$ dimension of 5 nm corresponds to a Vth of approximately 1.5 volts.

Referring again to FIG. 2, the gate structure 112 is formed at block 212. In some embodiments, a dielectric layer 115 is formed over at least a portion of layer 110 and within recessed area 126, and gate 114 is formed over dielectric layer 115. Dielectric layer 115 can be formed by depositing silicon dioxide ($SiO_2$), silicon nitride ($Si_3N_4$), aluminum oxide ($Al_2O_3$), tantalum pentoxide ($Ta_2O_5$), titanium dioxide ($TiO_2$), zinc peroxide ($ZiO_2$), hafnium oxide ($HfO_2$), and composites films over at least a portion of the upper surface of layer 110 and within recessed area 126.

In some embodiments, dielectric layer 115 is omitted and gate 114 is formed over at least a portion of layer 110 and within recessed area 126. As described above, gate 114 can be a metal gate formed from, for example, titanium nitride (TiN), aluminum (Al), gold (Au), tantalum (Ta), tantalum nitride (TaN), niobium (Nb), tungsten (W), nickel (Ni), or gate 114 can be a polysilicon gate as will be understood by one of ordinary skill in the art. In some embodiments, gate 114 is formed by creating a stack of TiN/Al, Ni/Au, WN/Al, or TiW/Al.

The multiple-layer gate structures and methods of forming an enhancement-mode transistor described herein advantageously enables the transistors to be fabricated more consistently such that the resulting transistors have more uniform threshold voltages. Additionally, the multiple-layer gate structure provides for improved turn-on resistance compared to conventional enhancement-mode devices.

Figure 5:
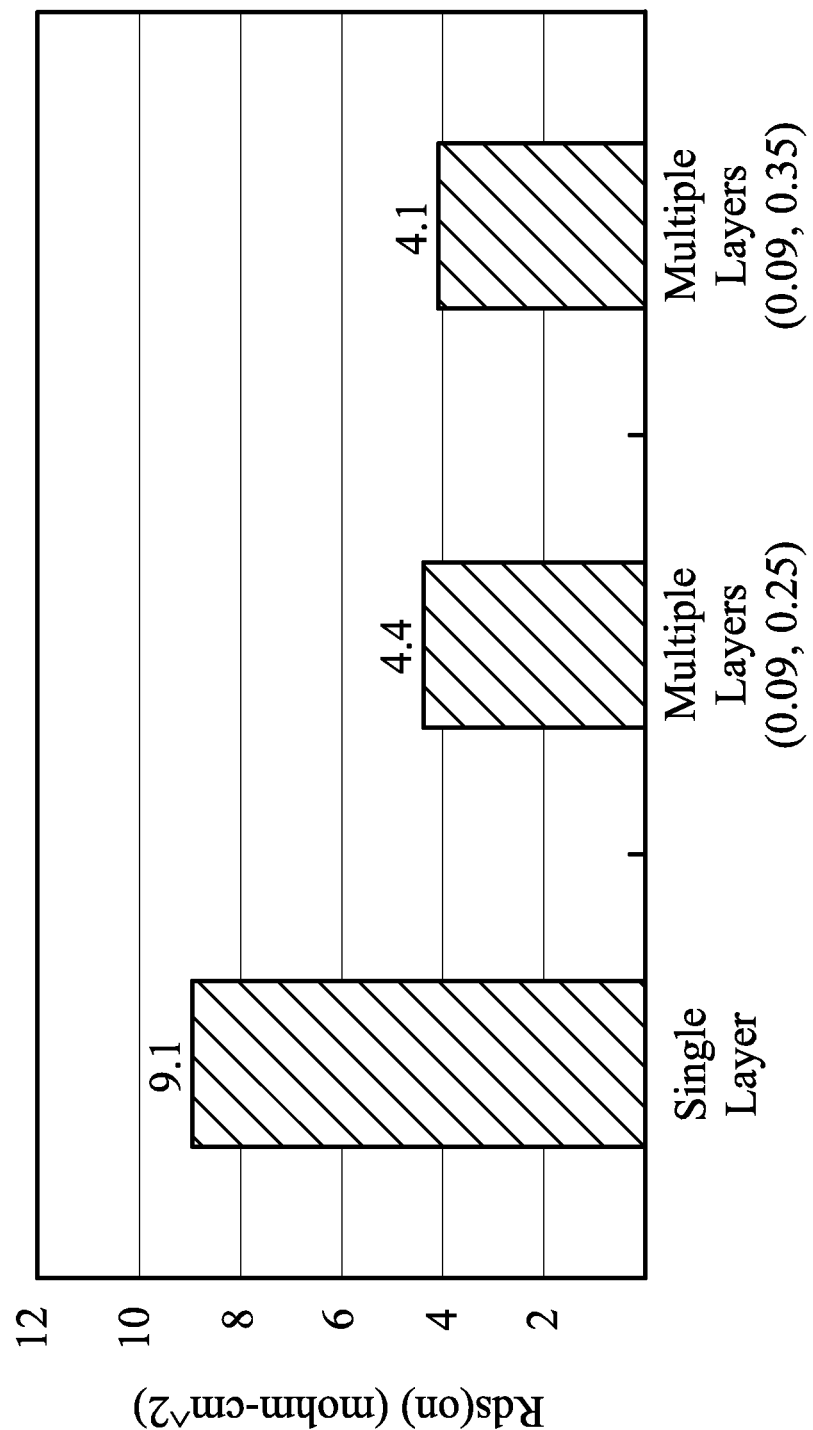
FIG. 5 is a graph comparing the drain source resistance of a conventional transistor with a transistor in accordance with the present disclosure.

For example, FIG. 5 is a graph comparing the drain-source resistance, Rds(on), of a conventional enhancement-mode transistor comprising a single layer of AlGaN over which the gate is formed to a pair of transistors in accordance with the embodiment illustrated in FIGS. 1A and 1B having different Al concentrations. In particular, the middle bar is for a transistor in which layer 106 had an Al concentration of 0.09 and layer 110 had an Al concentration of 025, and the bar on the right is for a transistor in which layer 106 had an Al concentration of 0.09 and layer 110 had an Al concentration of 0.35.

As shown in FIG. 5, the Rds(on) for both of the multi-layered transistors were less than half of the Rds(on) for the transistors with the single-layer structure. A lower Rds(on) provides improved turn-on characteristics as will be understood by one of ordinary skill in the art.

In some embodiments, a transistor includes a first layer of a first type, such as a layer of AlGaN, disposed over a buffer layer and having a first concentration of a first material. A first layer of a second type, such as a layer of AlN, is disposed over the first layer of the first type, and a second layer of the first type, such as a layer of AlGaN, is disposed over the first layer of the second type. The second layer of the first type having a second concentration of a first material that is greater than the first concentration of the first material. A source and a drain are spaced laterally from one another. A gate disposed over at least a portion of the second layer of the first type and disposed within a recessed area defined by the first and second layers of the first type and the first layer of the second type.

In some embodiments, a method includes forming a first layer of a first type over a buffer layer, forming a first layer of a second type, such as a layer of AlN, over the first layer of the first type, and forming a second layer of the first type over the first layer of the second type. The first layer of the first type, such as a layer of AlGaN, has a first concentration of a first material, and the second layer of the first type, such as a second layer of AlGaN, has a second concentration of the first material that is greater than the first concentration of the first material. A source and a drain are formed such that they are spaced laterally from one another over the buffer layer. A recessed area is formed through the first layer of the second type and the second layer of the first type and at least partially through the first layer of the first type. A gate is formed over at least a portion of the second layer of the first type and within the recessed area.

In some embodiments, a semiconductor device includes a buffer layer disposed over a substrate, and a first layer of a first type, such as a layer of AlGaN, disposed over the buffer layer. The first layer of the first type has a first concentration of a first material. A first layer of a second type, such as a layer of AlN, is disposed over the first layer of the first type. A second layer of the first type, such as a layer of AlGaN, is disposed over the first layer of the second type and has a second concentration of the first material that is greater than the first concentration of the first material. A source and a drain are spaced laterally from one another and are disposed over the buffer layer, and a gate is disposed over at least a portion of the second layer of the first type and is disposed within a recessed area defined by the first and second layers of the first type and the first layer of the second type such that a bottom surface of the gate is disposed below an upper surface of the first layer of the first type.

Although the devices and methods have been described in terms of exemplary embodiments, they are not limited thereto. Rather, the appended claims should be construed broadly, to include other variants and embodiments of the devices and methods, which may be made by those skilled in the art without departing from the scope and range of equivalents of the devices and methods.

What is claimed is:

1. A transistor, comprising:
    a first layer of a first type disposed over a buffer layer, the first layer of the first type having a first concentration of a first material;
    a first layer of a second type disposed over the first layer of the first type;
    a second layer of the first type disposed over the first layer of the second type, the second layer of the first type having a second concentration of the first material that is greater than the first concentration of the first material;
    a source and a drain laterally spaced from one another and disposed over the buffer layer; and
    a gate disposed over at least a portion of the second layer of the first type and disposed within a recessed area defined by the first and second layers of the first type and the first layer of the second type such that at least a portion of the first layer of the first type is interrupted by the gate.

2. The transistor of claim 1, wherein the buffer layer is formed over a semiconductor substrate.

3. The transistor of claim 1, wherein the gate is disposed over a dielectric layer that is disposed over the portion of the second layer of the first type and disposed within the recessed area defined by the first and second layers of the first type and the first layer of the second type.

4. The transistor of claim 1, wherein the first layer of the first type includes aluminum gallium nitride.

5. The transistor of claim 4, wherein the first concentration is in a range from 0.07 to 0.15 percent by weight, and the first material is aluminum.

6. The transistor of claim 4, wherein the second concentration is in a range from 0.21 to 0.50 percent by weight, and the first material is aluminum.

7. The transistor of claim 4, wherein the first layer of the second type includes aluminum nitride.

8. The transistor of claim 1, wherein the first layer of the first type has a thickness of 5 nm along a length of the recessed area.

9. The transistor of claim 1, wherein the gate includes a conductive material disposed over a dielectric material.

10. A method, comprising:
    forming a first layer of a first type over a buffer layer, the first layer of the first type having a first concentration of a first material;
    forming a first layer of a second type over the first layer of the first type;
    forming a second layer of the first type over the first layer of the second type, the second layer of the first type having a second concentration of the first material that is greater than the first concentration of the first material;
    forming a source and a drain over the buffer layer such that they are spaced laterally from one another; and
    forming a recessed area through the first layer of the second type and the second layer of the first type and at least partially through the first layer of the first type; and
    forming a gate over at least a portion of the second layer of the first type and within the recessed area.

11. The method of claim 10, further comprising forming the buffer layer over a substrate.

12. The method of claim 10, further comprising depositing a dielectric layer over at least a portion of the second layer of the first type and within the recessed area before the gate is formed.

13. The method of claim 10, wherein
    the first layer of the first type includes aluminum gallium nitride,
    the first material is aluminum,
    the first concentration is in a range from 0.07 to 0.15 percent by weight, and
    the second concentration is in a range from 0.21 to 0.50 percent by weight.

14. A semiconductor device, comprising:
    a buffer layer disposed over a semiconductor substrate;
    a first layer of a first type disposed over the buffer layer and having a first concentration of a first material;
    a first layer of a second type disposed over the first layer of the first type;
    a second layer of the first type disposed over the first layer of the second type and having a second concentration of the first material that is greater than the first concentration of the first material;
    a source and a drain laterally spaced from one another and disposed over the buffer layer; and
    a gate disposed over at least a portion of the second layer of the first type and disposed within a recessed area defined by the first and second layers of the first type and the first layer of the second type such that a bottom surface of the gate is disposed below an upper surface of the first layer of the first type.

15. The semiconductor device of claim 14, wherein the gate is disposed over a dielectric layer that disposed over the portion of the second layer of the first type and disposed within the recessed area defined by the first and second layers of the first type and the first layer of the second type such that a bottom-most surface of the dielectric layer is disposed above a bottom surface of the first layer of the first type.

16. The semiconductor device of claim 14, wherein the first layer of the first type includes aluminum gallium nitride.

17. The semiconductor device of claim 16, wherein the first concentration is in a range from 0.07 to 0.15 percent by weight, and the first material is aluminum.

18. The semiconductor device of claim 16, wherein the second concentration is in a range from 0.21 to 0.50 percent by weight, and the first material is aluminum.

19. The semiconductor device of claim 16, wherein the first layer of the second type includes aluminum nitride.

20. The semiconductor device of claim 14, wherein the first layer of the first type has a thickness of 5 nm along a length of the recessed area.

21. The semiconductor device of claim 14, further comprising an isolation region formed around a periphery of the enhancement-mode transistor.

* * * * *